(12) United States Patent
Ma et al.

(10) Patent No.: US 10,719,686 B2
(45) Date of Patent: Jul. 21, 2020

(54) DISPLAY PANEL AND DISPLAY DEVICE WITH FINGERPRINT RECOGNITION MODULE

(71) Applicant: Wuhan Tianma Micro-Electronics Co., Ltd., Wuhan (CN)

(72) Inventors: Yangzhao Ma, Wuhan (CN); Tao Peng, Wuhan (CN); Yongzhi Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 4 days.

(21) Appl. No.: 16/173,048

(22) Filed: Oct. 29, 2018

(65) Prior Publication Data

US 2019/0370524 A1 Dec. 5, 2019

(30) Foreign Application Priority Data

May 29, 2018 (CN) .......................... 2018 1 0529772

(51) Int. Cl.
*G06K 9/00* (2006.01)
*G06F 3/041* (2006.01)
(Continued)

(52) U.S. Cl.
CPC ......... *G06K 9/0004* (2013.01); *G06F 3/0412* (2013.01); *G09G 3/22* (2013.01); *H01L 27/124* (2013.01); *H01L 27/1255* (2013.01)

(58) Field of Classification Search
CPC ...... G06K 9/0004; G06F 3/0412; G09G 3/22; H01L 27/124; H01L 27/1255
See application file for complete search history.

(56) References Cited

U.S. PATENT DOCUMENTS

| 2004/0252867 A1* | 12/2004 | Lan ...................... G06K 9/0004 382/124 |
| 2005/0205958 A1* | 9/2005 | Taniguchi ......... H01L 27/14621 257/436 |

(Continued)

FOREIGN PATENT DOCUMENTS

| CN | 107133613 A | 9/2017 |
| CN | 107194321 A | 9/2017 |

OTHER PUBLICATIONS

Chinese Office Action for application No. 201810529772.2; reported dated Apr. 17, 2020.

*Primary Examiner* — Alexander Eisen
*Assistant Examiner* — Nathaniel P Brittingham
(74) *Attorney, Agent, or Firm* — Miller, Matthias & Hull LLP

(57) ABSTRACT

Provided are a display panel and a display device. The display panel includes an array substrate, a fingerprint recognition module and a fingerprint recognition light source. The array substrate includes a base substrate, a driving functional layer and a light-emitting functional layer. Light emitted from the fingerprint recognition light source is reflected by a touch object and then received by the fingerprint recognition unit. At least one of the fingerprint recognition module and the fingerprint recognition light source is located at a side of the base substrate facing away from the driving functional layer. The driving functional layer includes a plurality of driving units. The plurality of driving units comprise first driving units in the first region and second driving units in the second region.

16 Claims, 12 Drawing Sheets

(51) Int. Cl.
*G09G 3/22* (2006.01)
*H01L 27/12* (2006.01)

(56) References Cited

U.S. PATENT DOCUMENTS

| | | | |
|---|---|---|---|
| 2015/0279335 A1* | 10/2015 | Ripp | G09G 5/26 |
| | | | 345/428 |
| 2016/0057396 A1* | 2/2016 | Phan | G02F 1/133514 |
| | | | 348/266 |
| 2018/0005007 A1* | 1/2018 | Du | H01L 27/3262 |
| 2019/0370524 A1* | 12/2019 | Ma | H01L 27/1255 |

* cited by examiner

DISPLAY PANEL AND DISPLAY DEVICE WITH FINGERPRINT RECOGNITION MODULE

CROSS-REFERENCE TO RELATED APPLICATIONS

This application claims priority to a Chinese patent application No. 201810529772.2 filed on May 29, 2018, the disclosure of which is incorporated herein by reference in its entirety.

TECHNICAL FIELD

The present disclosure relates to display technologies, and in particular relates to a display panel and a display device.

BACKGROUND

Fingerprints are inherent and unique to everyone. With the development of technology, a variety of display devices with fingerprint recognition functions have appeared on the market, such as mobile phones, tablets, smart wearable devices, and the like. In this way, before operating the display devices with fingerprint recognition functions, users only need to touch the fingerprint recognition sensors of the display devices with finger a to perform right verification, which simplifies the authentication process.

In an existing display device, fingerprint recognition sensors are directly disposed in the display region of the display panel, and fingerprint recognition sensors realize fingerprint recognition by receiving light reflected by fingerprint. How to improve the accuracy of fingerprint recognition technology in an integrated screen is an important problem in the industry.

SUMMARY

The present disclosure provides a display panel and a display device so as to improve the accuracy of fingerprint recognition.

In a first aspect, the present disclosure provides a display panel, and the display panel includes: an array substrate, a fingerprint recognition module and a fingerprint recognition light source.

The array substrate includes a base substrate, a driving functional layer and a light-emitting functional layer, and the driving functional layer is configured to drive the light-emitting functional layer to emit light.

The fingerprint recognition module includes at least one fingerprint recognition unit.

The light emitted from the fingerprint recognition light source is reflected by a touch object and then received by the fingerprint recognition unit for the fingerprint recognition.

At least one of the fingerprint recognition module and the fingerprint recognition light source is located at a side of the base substrate facing away from the driving functional layer.

The driving functional layer includes a plurality of driving units.

The driving functional layer includes a first region and a second region. The first region includes a plurality of first driving units, and the second region includes a plurality of second driving units.

An area of the first driving unit is greater than that of the second driving unit, and an area of the light transmitting region of the first driving unit is greater than that of the light transmitting region of the second driving unit.

A vertical projection of the fingerprint recognition unit on the driving functional layer overlaps at least in part with the light transmitting region of the first driving unit.

In a second aspect, the present disclosure provides a display device including the display panel provided in any embodiments of the present disclosure.

In the embodiments of the present disclosure, the area of the first driving unit is greater than that of the second drive unit, the area of the light transmitting region of the first driving unit is greater than that of the light transmitting region of the second driving unit, and the vertical projection of the fingerprint recognition unit on the driving functional layer overlaps at least in part with the light transmitting region of the first driving unit, such that the intensity of the light emitted from the fingerprint recognition light source and reflected by the finger and the intensity of the light received the fingerprint recognition unit, thereby improving the accuracy of fingerprint recognition.

DETAILED DESCRIPTION

Figure 1:
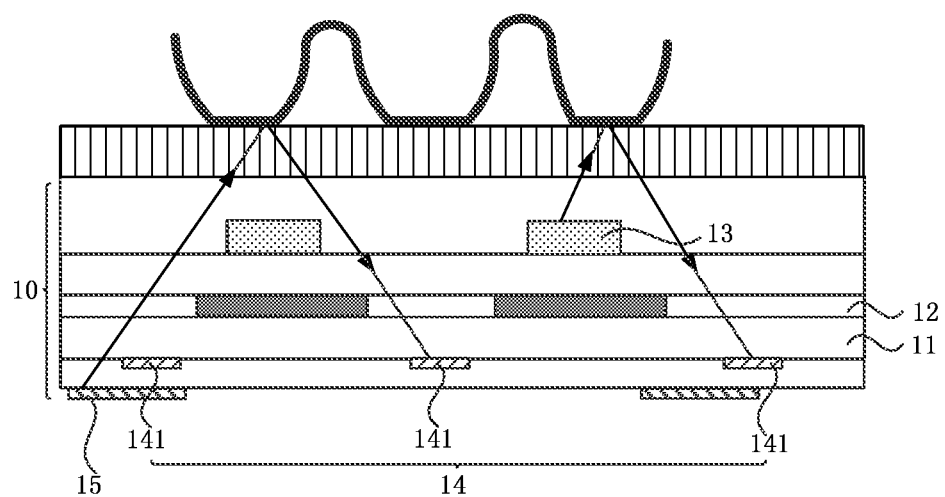
FIG. 1 is a sectional view of a display panel according to an embodiment of the present disclosure.

The present disclosure is further detailed below in combination with the drawings and embodiments. It should be understood that, the specific embodiments described herein are merely used to explain the present disclosure rather than limiting the present disclosure. In addition, it should be stated that in order to facilitate the description, merely a part of structures related to the present disclosure rather than the whole structure are illustrated in the drawings.

Figure 2:
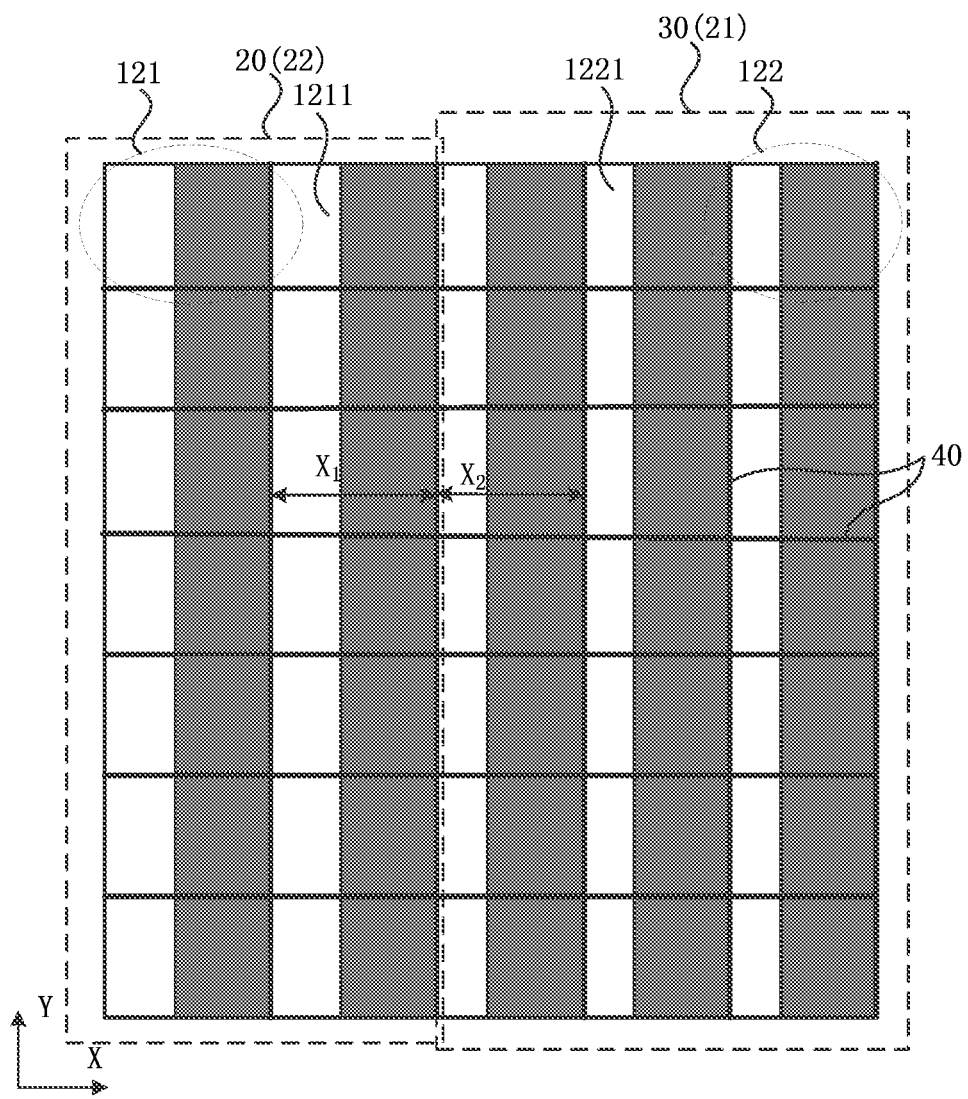
FIG. 2 is a schematic top view of a driving functional layer according to an embodiment of the present disclosure.

FIG. 1 is a sectional view of a display panel according to an embodiment of the present disclosure. FIG. 2 is a schematic top view of a driving functional layer according to an embodiment of the present disclosure. This embodiment provides a display panel, as shown in FIG. 1 and FIG. 2, the display panel includes: an array substrate 10, a fingerprint recognition module 14, and fingerprint recognition light source 15.

The array substrate 10 includes a base substrate 11, a driving functional layer 12 and a light-emitting functional layer 13. The driving functional layer 12 is configured to drive the light-emitting functional layer 13 to emit light.

The fingerprint recognition module 14 includes at least one fingerprint recognition unit 141.

The light emitted from the fingerprint recognition light source 15 is reflected by a touch object to the fingerprint recognition unit 141 for a fingerprint recognition.

At least one of the fingerprint recognition module 14 and the fingerprint recognition light source 15 is located at a side of the base substrate 11 facing away from the driving functional layer 12.

The driving functional layer 12 includes a plurality of driving units. The driving functional layer 12 includes a first region 20 and a second region 30. The first region 20 includes a plurality of first driving units 121, and the second region 30 includes a plurality of second driving units 122. The area of the first driving unit 121 is greater than the area of the second driving unit 122, and the area of the light transmitting region of the first driving unit 121 is greater than the area of the light transmitting region of the second driving unit 122. A vertical projection of the fingerprint recognition unit 141 on the driving functional layer 12 overlaps at least in part with the light transmitting region 1211 of the first driving unit 121.

The light-emitting functional layer 13 includes a plurality of light-emitting units (not shown in drawings). The driving units are repeat units on the driving functional layer 12, and each driving unit is configured to drive a corresponding light-emitting unit to emit light. Exemplarily, as shown in FIG. 2, the plurality of driving units are defined by lines 40, the lines 40 may be virtual lines or real lines in the driving functional layer 12. For example, the driving functional layer 12 further includes a plurality of signal lines that cross each other, such as scanning lines, data lines, reference voltage lines and power lines and the like. The plurality of signal lines that cross each other can define the plurality of driving units arranged in matrix. The lines 40 may be the signal lines defining the driving units. The light transmitting region of the driving unit refers to the region where no opaque device is arranged, and the opaque device may be the signal line, a through-hole, a thin film transistor, a capacitor and the like. Those skilled in the art should understand that drawings in this application merely schematically show the position and shape of the light transmitting region. The position and shape of the light transmitting region in this application can be designed according to the actual layout of the panel, and is not limited in this application.

In one or more embodiments, at least one of the fingerprint recognition module 14 and the fingerprint recognition light source 15 is located at a side of the base substrate 11 facing away from the driving functional layer 12. When the fingerprint recognition light source 15 is located at the side of the base substrate 11 facing away from the driving functional layer 12, the light emitted from the fingerprint recognition light source 15 needs to pass through the light transmitting region of the driving functional layer 12 to reach the finger (touch object), the light reflected by the finger enters the fingerprint recognition unit 141 for a fingerprint recognition. When the fingerprint recognition unit 141 is located at the side of the base substrate 11 facing away from the driving functional layer 12, the light reflected by the finger enters the fingerprint recognition unit 141 by passing through the light transmitting region of the driving functional layer 12, so as to perform the fingerprint recognition. When both the fingerprint recognition module 14 and the fingerprint recognition light source 15 are located at the side of the base substrate 11 facing away from the driving functional layer 12 (refer to FIG. 1), the light emitted from the fingerprint recognition light source 15 reaches the finger through the light transmitting region of the driving functional layer 12, and the light reflected by the finger enters the fingerprint recognition unit 141 through the light transmitting region of the driving functional layer 12, so as to perform the fingerprint recognition. Therefore, the optical transmission performance of the driving functional layer 12 directly affects the intensity of the light that finally enters the fingerprint recognition unit 141, thus affecting the accuracy of fingerprint recognition.

In this embodiment, the area of the first driving unit is greater than the area of the second driving unit, the area of the light transmitting region of the first driving unit is greater than the area of the light transmitting region of the second driving unit, and the vertical projection of the fingerprint recognition unit 141 on the driving functional layer overlaps at least in part with the light transmitting region of the first driving unit. Therefore, the intensity of the light which is emitted from the fingerprint recognition light source and irradiates the finger and the intensity of the light which is reflected by the finger and enters the fingerprint recognition unit are increased, thereby improving the accuracy of fingerprint recognition.

It should be noted that, when the fingerprint recognition module 14 is located at the side of the base substrate 11 facing away from the driving functional layer 12, the fingerprint recognition light source may be an outer mounted light source. In an alternative embodiment, the fingerprint recognition light source is the light-emitting functional layer 13, that is, the light-emitting functional layer 13 is reused as the fingerprint recognition light source 15. FIG. 1 exemplarily shows optical paths when the fingerprint recognition light source 15 is an outer mounted light source and when the light-emitting functional layer 13 is reused as the fingerprint recognition light source 15 respectively. Those skilled in the art can choose the appropriate one as the fingerprint recognition light source according to the need, which is not limited in the present disclosure. When the fingerprint recognition module 14 is located at a side of the driving functional layer 12 facing away from the base substrate 11, the fingerprint recognition light source 15 is the outer mounted light source located at the side of the base substrate 11 facing away from the driving functional layer 12. In the present disclosure, the plurality of fingerprint recognition units 141 may be in one-to-one correspondence with the plurality of first driving units 121, or a part of the plurality of first driving units 121 correspondingly arranged with the plurality of fingerprint recognition units 141, the arrangement of the fingerprint recognition units 141 and the first driving units 121 is not limited in this application, and depends on the specific situation. In addition, the light-emitting functional layer 13 of the exiting display panel includes a reflecting electrode, and the reflecting electrode is made of opaque metal. However, the reflection electrode is relatively small compared to the driving unit, and the projection of the reflection electrode on the driving functional layer 12 is usually located in the opaque region of the driving unit. Therefore, the light transmitting region of the driving functional layer 12 in this embodiment is equivalent to the light transmitting region of the display panel. By increasing the area of the light transmitting region 1211 of the first driving unit 121 in the driving functional layer 12, the area of light transmitting region of the display panel is increased, thereby improving the accuracy of fingerprint recognition.

Figure 3:
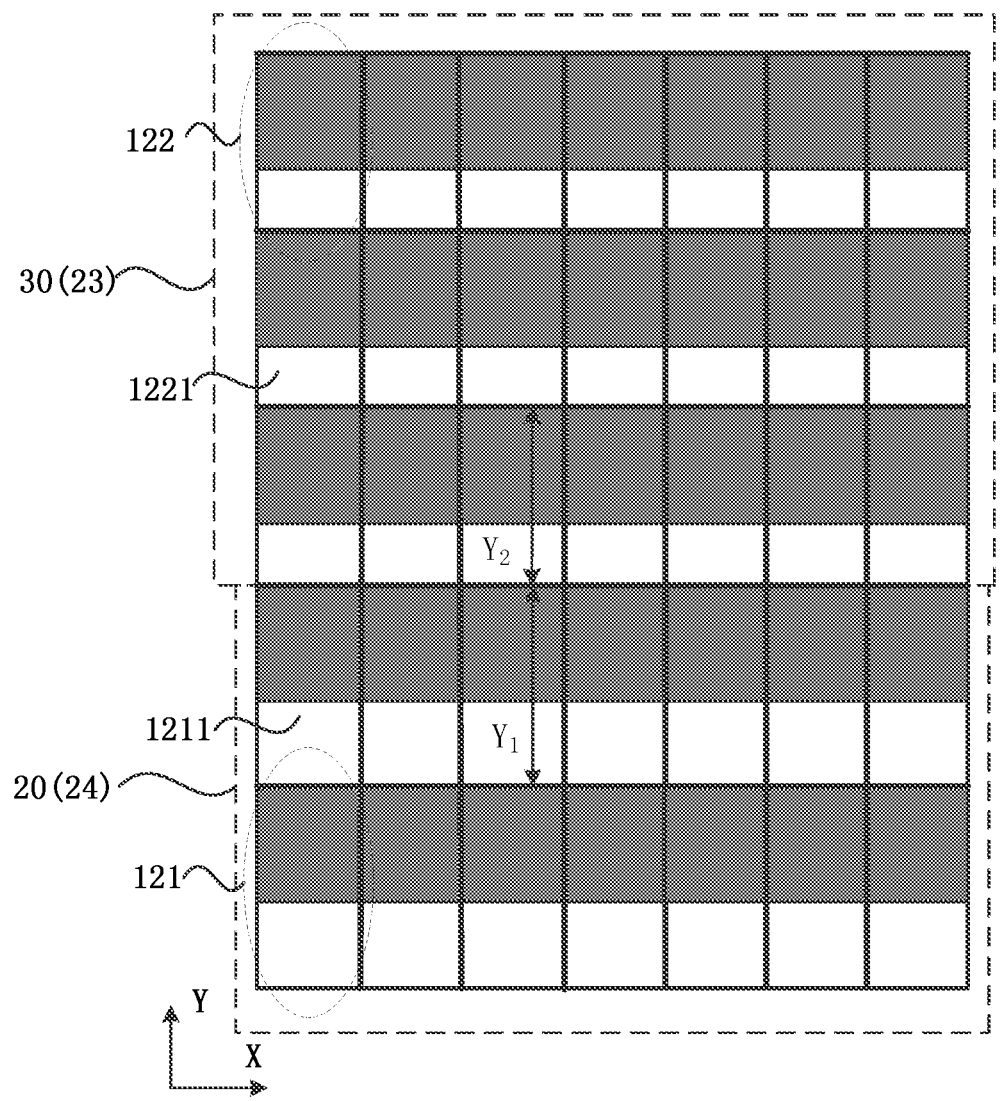
FIG. 3 is a schematic top view of another driving functional layer according to an embodiment of the present disclosure.

FIG. 3 is a schematic top view of another driving functional layer according to an embodiment of the present disclosure. In an exemplary embodiment, referring to FIG. 2 and FIG. 3, a first size X1 of the first driving unit 121 along a first direction X is greater than a second size X2 of the second driving unit 122 along the first direction X. A third size Y1 of the first driving unit 121 along a second direction Y is greater than a fourth size Y2 of the second driving unit 122 along the second direction Y, and the first direction X and the second direction Y cross each other.

Specifically, the first direction X may be the row direction of the display panel, and the second direction Y can be the column direction of the display panel. The area of the first drive unit 121 may be increased by increasing the first size X1 of the first driving unit 121. The area of the first drive unit 121 may also be increased by increasing the third size Y1 of the first driving unit 121. The area of the first drive unit 121 can also be increased by increasing both the first size X1 and the third size Y1, there being no specific limitation in this embodiment.

In one or more embodiments, the display panel is a full high definition (FHD) display panel, the difference between the first size and the second size ranges from 2 microns to 20 microns, and the difference between the third size and the fourth size ranges from 5 microns to 30 microns.

The resolution of the FHD display panel is generally 1920*1080. By setting the difference between the first size and the second size to range from 2 microns to 20 microns and setting the difference between the third size and the fourth size to range from 5 microns to 30 microns, the area of the light transmitting region of the first drive unit in the first region is increased while ensuring the high resolution of the display panel, thereby improving the accuracy of fingerprint recognition.

In one or more embodiments, the display panel is a wide quad high definition (WQHD) display panel, the difference between the first size and the second size ranges from 1.5 microns to 15 microns, and the difference between the third size and the fourth size ranges from 4 microns to 20 microns.

Specifically, the resolution of the WQHD display panel is generally 2560*1440. By setting the difference between the first size and the second size to range from 1.5 microns to 15 microns and setting the difference between the third size and the fourth size to range from 4 microns to 20 microns, the area of the light transmitting region of the first drive unit in the first region is increased while ensuring the high resolution of the display panel, thereby improving the accuracy of fingerprint recognition.

In one or more embodiments, referring to FIG. 2, the driving functional layer 12 includes a first driving region 21 and a second driving region 22, and the first driving region 21 and the second driving region 22 are arranged side by side along the first direction X. The size of the driving unit in the second driving region 22 along the first direction X is greater than the size of the driving unit in the first driving region 21 along the first direction X, and the size of the driving unit in the second driving region 22 along the second direction Y is equal to the size of the driving unit in the first driving region 21 along the second direction Y. The second driving region 22 includes the first region.

In this way, the size of the first drive unit along the first direction may be increased without changing the extension direction of the signal line extending along the second direction Y, which reduces the layout and production difficulty of the display panel. It should be noted that; FIG. 2 merely exemplarily shows the positions and sizes of the first driving region 21, the second driving region 22, the first region 20 and the second region 30, and FIG. 2 merely exemplarily shows an example in which the sizes of the first region 20 are equal to the sizes of the second driving region 22, which is not the limitation of the present disclosure. Those skilled in the art should understand that, when the second driving region 22 includes the first region 20, the first region 20 may be any region in the second driving region 22, or the sizes of the first region 20 can also be equal to that of the second driving region 22. The sizes, shape and position of the first region 20 are set according to specific needs.

In one or more embodiments, referring to FIG. 3, the driving functional layer 12 includes a third driving region 23 and a fourth driving region 24, and the third driving region 23 and the fourth driving region 24 are arranged side by side along the second direction Y. The size of the driving unit in the fourth driving region 24 along the second direction Y is greater than the size of the driving unit in the third driving region 23 along the second direction Y, and the size of the driving unit in the fourth driving region 24 along the first direction X is equal to the size of the driving unit in the third driving region 23 along the first direction X. The fourth driving region 24 includes the first region.

In this way, the size of the first drive unit along the second direction Y is increased without changing the extension direction of the signal line extending along the first direction X, which reduces the layout and production difficulty of the display panel. It should be noted that, FIG. 3 merely exemplarily shows the positions and sizes of the third driving region 23, the fourth driving region 24, the first region 20 and the second region 30, and FIG. 3 merely exemplarily shows an example that the sizes of the first region 20 are equal to that of the fourth driving region 24, which is not the limitation of the present disclosure. Those skilled in the art should understand that, when the fourth driving region 24 includes the first region 20, the first region 20 may be any region in the fourth driving region 24, or the sizes of the first region 20 may be equal to that of the fourth driving region 24. The sizes, shape and position of the first region 20 may be set according to specific needs.

Figure 4:
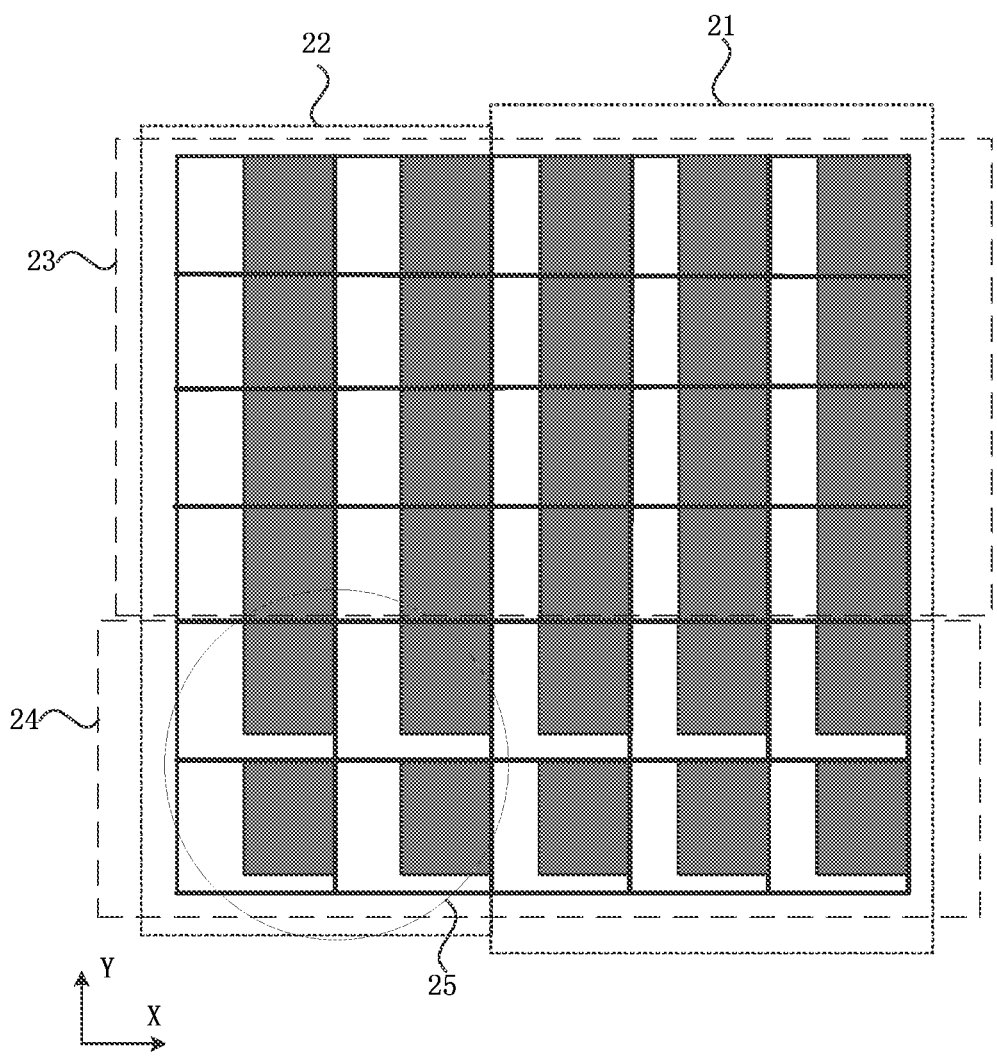
FIG. 4 is a schematic top view of another driving functional layer according to an embodiment of the present disclosure.

FIG. 4 is a top view of another driving functional layer according to an embodiment of the present disclosure. As shown in FIG. 4, driving functional layer includes a first driving region 21 and a second driving region 22, and the first driving region 21 and the second driving region 22 are arranged side by side along the first direction X. The size of the driving unit in the second driving region 22 along the first direction X is greater than the size of the driving unit in the first driving region 21 along the first direction X. The driving functional layer 12 includes a third driving region 23 and a fourth driving region 24, and the third driving region 23 and the fourth driving region 24 are arranged side by side along the second direction Y. The size of the driving unit in the fourth driving region 24 along the second direction Y is greater than the size of the driving unit in the third driving region 23 along the second direction Y. The overlapping region 25 between the fourth driving region 24 and the second driving region 22 includes the first region.

In this way, both the size of the driving unit in the first region along the first direction X and the size of the driving unit in the first region along the second direction Y are increased, and the area of the light transmitting region of the first driving unit is further increased, thereby increasing the accuracy of fingerprint recognition.

Figure 5:
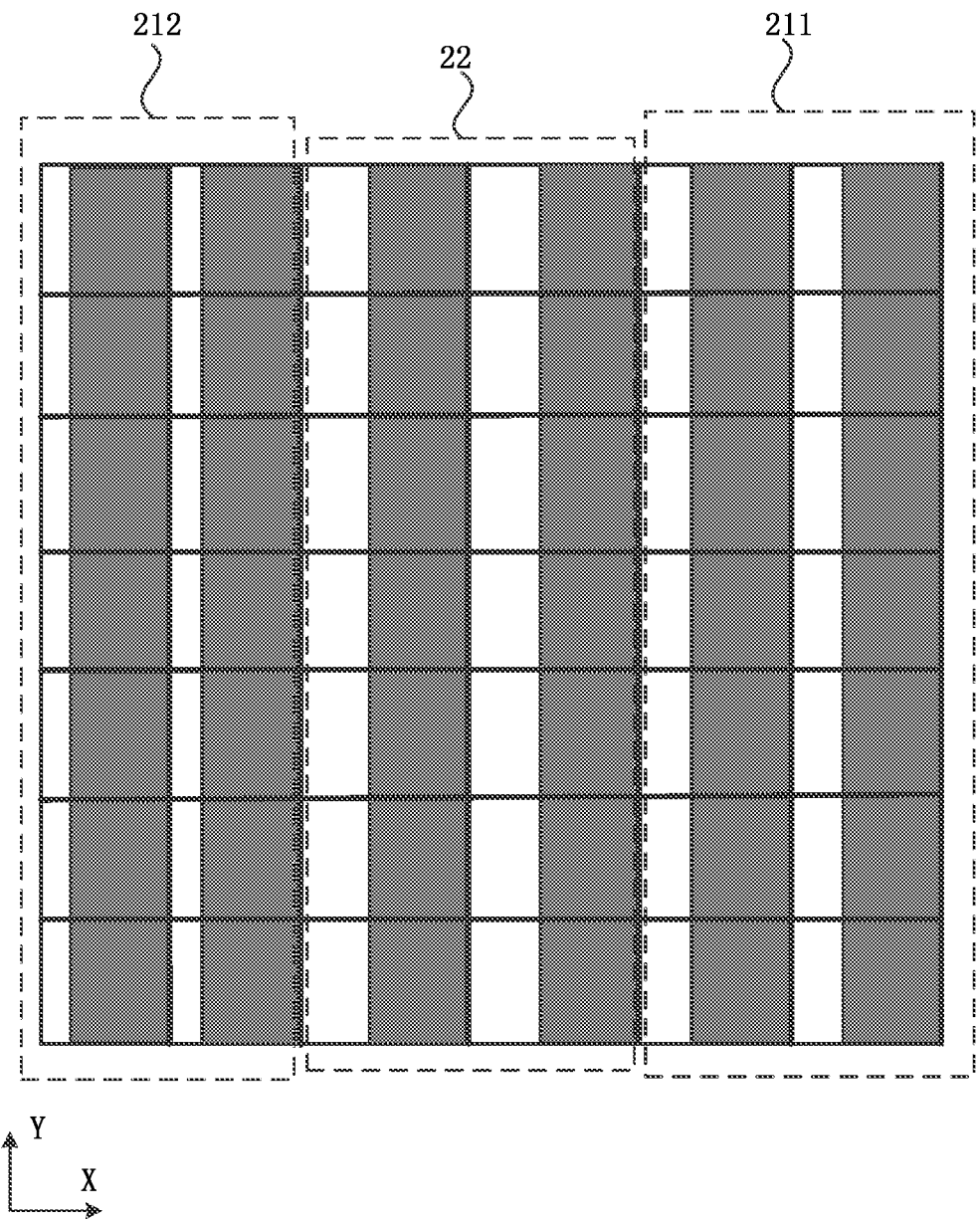
FIG. 5 is a schematic top view of another driving functional layer according to an embodiment of the present disclosure.

FIG. 5 is a top view of another driving functional layer according to an embodiment of the present disclosure. As shown in FIG. 5, the first driving region 21 includes a first driving sub-region 211 and a second driving sub-region 212, and the first driving sub-region 211 and the second driving sub-region 212 are located on two sides of the second driving region 22 respectively. The size of the driving unit in the first driving sub-region 211 along the first direction X is greater than or equal to the size of the driving unit in the second driving sub-region 212 along the first direction X.

Specifically, the size of the driving unit in the first driving sub-region 211 along the first direction X is greater than the size of the driving unit in the second driving sub-region 212 along the first direction X, that is, the size of the driving unit in the second driving sub-region 212 along the first direction X is reduced, which can ensure a high resolution of the entire display panel. Further, both the size of the driving unit in the first driving sub-region 211 along the first direction X and the size of the driving unit in the second driving sub-region 212 along the first direction X are reduced, thereby further increasing the resolution of the entire display panel.

Specifically, the first direction is the row direction of the display panel, and the size along the first direction is the width, the second direction is the column direction of the display panel, and the size along the first second direction is the length. This embodiment illustrates the lengths of driving units in various regions by taking the FHD display panel as an example, which has a diagonal line of 6.01 inches and an aspect ratio of 18:9. The original resolution of the display panel without changing the sizes of the drive units is 1080*2160, and the original sizes of the driving unit is as follows: the width is 31.2 microns and the length is 63.2 microns.

TABLE 1

| 6.01FHD (18:9) | Original sizes | Solution 1 | Solution 2 |
|---|---|---|---|
| Resolution | 1080 * 2160 | 1038 * 2160 | 1012 * 2160 |
| Sizes of the driving unit in the first driving region (width * length) | 31.2 * 63.2 | 31.2 * 63.2 | 31.2 * 63.2 |
| Sizes of the driving unit in the second driving region (width * length) | 31.2 * 63.2 | 41.2 * 63.2 | 51.2 * 6 3.2 |

With reference to Table 1, the width of the second driving region is 11 millimeters. In solution 1: the width of the driving unit in the second driving region is increased by 10 microns, and the size of the driving unit in the second driving region is unchanged. In solution 2: the width of the driving unit in the second driving region is increased by 20 microns, and the size of the driving unit in the second driving region is unchanged. In solution 1 and solution 2, the sizes of the driving units in the first driving sub-region and in the second driving sub-region are unchanged. The optical transmittance of the driving unit in solution 1 increased by 7.6% and the display panel is decreased by 42 columns. The optical transmittance of the driving unit in solution 2 increased by 10.8% and the display panel is decreased by 68 columns. Therefore, when the width of the driving unit in the second driving region is increased, the width of the driving units in the first driving sub-region and the width of the driving units in the second driving sub-region are equal to the original width of the driving unit, so the optical transmittance is effectively improved, thereby enhancing the accuracy of fingerprint recognition.

TABLE 2

| 6.01FHD (18:9) | Original sizes | Solution 3 | Solution 4 |
|---|---|---|---|
| Resolution | 1080 * 2160 | 1080 * 2160 | 1080 * 2 160 |
| Sizes of the driving unit in the first driving region (width * length) | 31.2 * 63.2 | 30.2 * 63.2 | 29.4 * 63.2 |
| Sizes of the driving unit in the second driving region (width * length) | 31.2 * 63.2 | 41.2 * 63.2 | 51.2 * 63.2 |

With reference to Table 2, the width of the second driving region is 11 millimeters. In solution 3, the width of the driving unit in the second driving region is increased by 10 microns, the width of the driving unit in the first driving region is decreased by 1 micron, and the size of the driving unit in the second driving region and the size of the driving unit in the first driving region are unchanged. In solution 4: the width of the driving unit in the second driving region is increased by 20 microns, the width of the driving unit in the first driving region is decreased by 1.8 microns, and the size of the driving unit in the second driving region and the size of the driving unit in the first driving region are unchanged. The optical transmittance of the driving unit in solution 3 is increased by 7.6% and the resolution is unchanged, the optical transmittance of the driving unit in solution 4 increased by 10.8% and the resolution is unchanged. By increasing the width of the driving unit in the second driving region and reducing the width of the driving unit in the first driving sub-region and the width of the driving unit in the second driving sub-region, the optical transmittance is effectively improved, improving the accuracy of fingerprint recognition, and a high resolution of the entire display panel is ensured.

Figure 6:
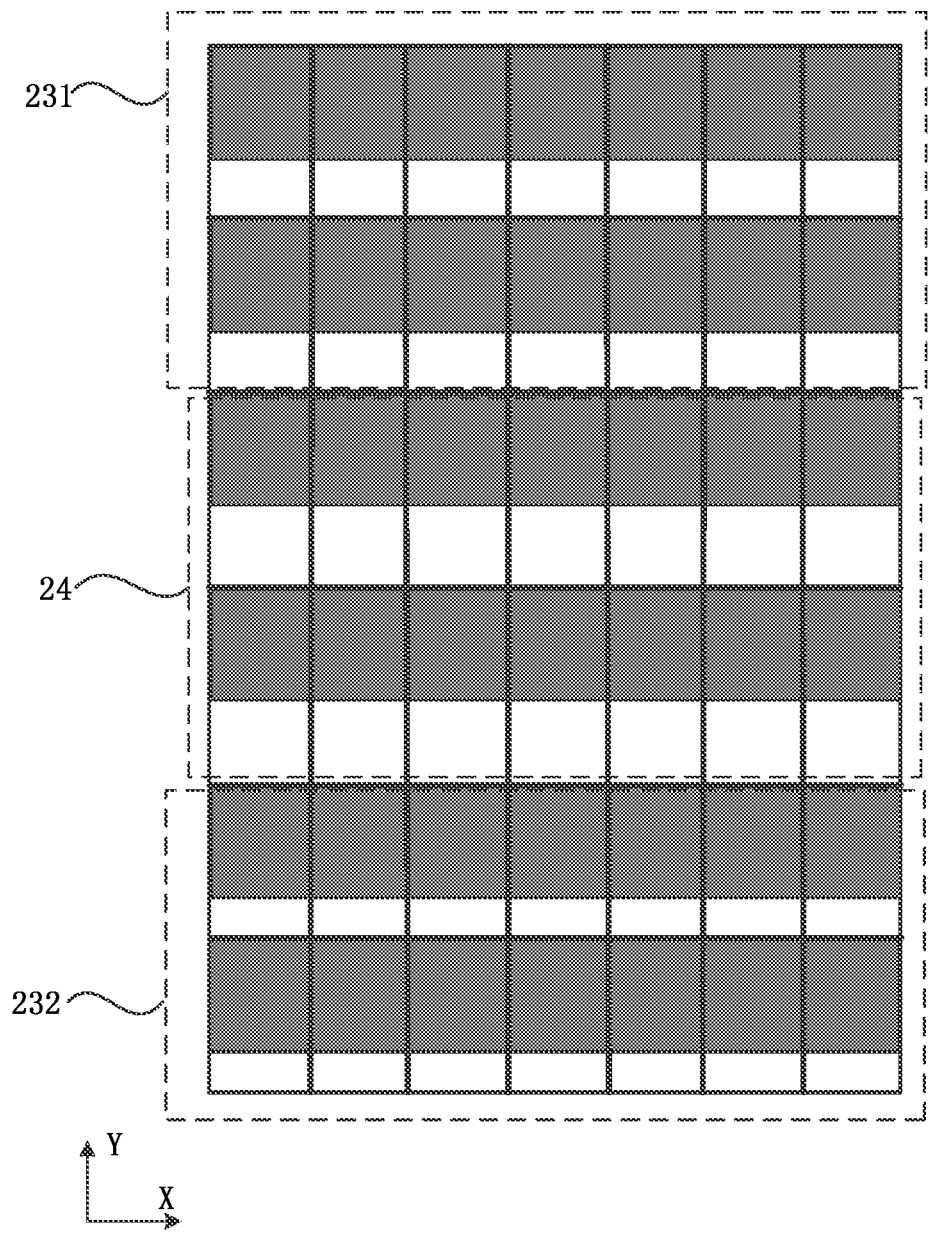
FIG. 6 is a schematic top view of another driving functional layer according to an embodiment of the present disclosure.

FIG. 6 is a top view of another driving functional layer according to an embodiment of the present disclosure. As shown in FIG. 6, the third driving region 23 includes a third driving sub-region 231 and a fourth driving sub-region 232.

The size of the driving unit in the third driving sub-region 231 along the second direction Y is greater than or equal to the size of the driving unit in the fourth driving sub-region 232 along the second direction Y.

Specifically, the size of the driving unit in the third driving sub-region 231 along the second direction Y is greater than or equal to the size of the driving unit in the fourth driving sub-region 232 along the second direction Y, that is, the size of the driving unit in the fourth driving sub-region 232 along the first direction X is reduced, which can ensure a high resolution of the entire display panel. Further, both the size of the driving units in the third driving sub-region 231 along the first direction X and the size of the driving unit in the fourth driving sub-region 232 along the first direction X are reduced, thereby further increasing the resolution of the entire display panel.

TABLE 3

| 6.01FHD (18:9) | Original sizes | Solution 5 | Solution 6 |
|---|---|---|---|
| Resolution | 1080 * 2160 | 1080 * 2138 | 1080 * 2124 |
| Sizes of the driving unit in the fourth driving region | 31.2 * 63.2 | 31.2 * 73.3 | 31.2 * 83.4 |

TABLE 3-continued

| 6.01FHD (18:9) | Original sizes | Solution 5 | Solution 6 |
|---|---|---|---|
| (width * length) | | | |
| Sizes of the driving unit in the third driving region (width * length) | 31.2 * 63.2 | 31.2 * 63.2 | 31.2 * 63.2 |

With reference to Table 3, the width of the fourth driving region is 11 millimeters. In solution 5, the size of the driving unit in the fourth driving region is increased by 10 microns, and the width is the same as the width of the driving unit in the fourth driving region in the original configuration. The optical transmittance of the driving unit in solution 5 is increased by 11.2% and the display panel is decreased by 22 lines. By increasing the size of the driving unit in the fourth driving region and keeping the size of the driving unit in the third driving sub-region and the size of the driving unit in the fourth driving sub-region both equal to the original size of the driving unit, the optical transmittance is effectively improved, thereby improving the accuracy of fingerprint recognition. In solution 6 the size of the driving unit in the fourth driving region is increased by 20 microns, the width is the same as the width of the driving unit in the fourth driving region in the original configuration, and the optical transmittance of the driving unit is further improved.

TABLE 4

| 6.01FHD (18:9) | Original sizes | Solution 7 | Solution 8 |
|---|---|---|---|
| Resolution | 1080 * 2160 | 1080 * 2160 | 1080 * 2160 |
| Sizes of the driving unit in the fourth driving region (width * length) | 31.2 * 63.2 | 31.2 * 73.3 | 31.2 * 83.4 |
| Sizes of the driving unit in the third driving region (width * length) | 31.2 * 63.2 | 31.2 * 62.4 | 31.2 * 61.8 |

With reference to Table 4, the width of the fourth driving region is 11 millimeters. In solution 7, the size of the driving unit in the fourth driving region is increased by 10.1 microns, the size of the driving unit in the third driving region is decreased by 0.8 microns, and the width of the driving unit in the fourth driving region and the width of the driving unit in the third driving region are unchanged. The optical transmittance of the driving unit in solution 7 increased by 11.2% and the vertical resolution of the display panel is unchanged. By increasing the size of the driving unit in the fourth driving region and decreasing the size of the driving unit in the third driving sub-region and the size of the driving unit in the fourth driving sub-region, the optical transmittance is effectively improved, improving the accuracy of fingerprint recognition, and a high resolution of the entire display panel is ensured. In solution 8, the size of the driving unit in the fourth driving region is increased by 20.3 microns, the size of the driving unit in the third driving region is decreased by 1.4 microns and the width of the driving unit in the fourth driving region and the width of the driving unit in the third driving region are unchanged, the optical transmittance is further improved without changing the resolution of the display panel.

Figure 7:
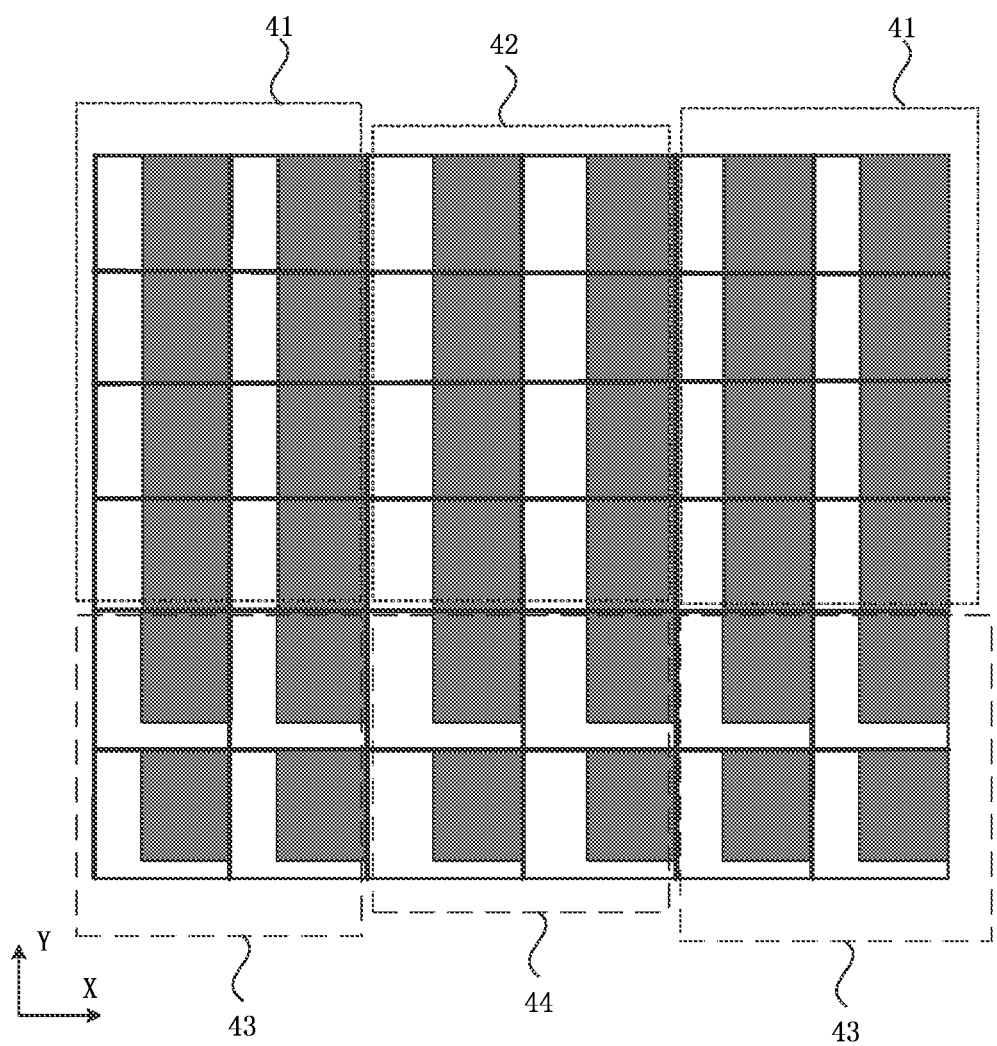
FIG. 7 is a schematic top view of another driving functional layer according to an embodiment of the present disclosure.

FIG. 7 is a top view of another driving functional layer according to an embodiment of the present disclosure. With reference to FIG. 5 to FIG. 7, the driving functional layer includes the first driving sub-region 211, the second driving region 22 and the second driving sub-region 212 which are arranged in the first direction X, and the third driving region 23 and the fourth driving region 24 which are arranged in the second direction Y. The first driving sub-region 211 and the second driving sub-region 212 overlap the third drive region 23, and have a first overlapping region 41 with the third drive region 23. The second driving region 22 and the third driving region 23 have a second overlapping area 42. The first driving sub-region 211 and the second driving sub-region 212 overlap the fourth driving region 24, and have a third overlapping region 43 with the fourth driving region 24. The second driving region 22 and the fourth driving region 23 have a fourth overlapping region 44, and the fourth overlapping region 44 includes the first region. The diameter of the fourth overlapping region is 11 millimeters.

TABLE 5

| 6.01FHD (18:9) | Original sizes | Solution 9 | Solution 10 |
|---|---|---|---|
| Resolution | 1080 * 2160 | 1080 * 2138 | 1080 * 2124 |
| Sizes of the driving unit in the first overlapping region (width * length) | 31.2 * 63.2 | 31.2 * 63.2 | 31.2 * 63.2 |
| Sizes of the driving unit in the second overlapping region (width * length) | 31.2 * 63.2 | 41.2 * 63.2 | 51.2 * 63.2 |
| Sizes of the driving unit in the third overlapping region (width * length) | 31.2 * 63.2 | 31.2 * 73.2 | 31.2 * 83.2 |
| Sizes of the driving unit in the fourth overlapping region (width * length) | 31.2 * 63.2 | 41.2 * 73.2 | 51.2 * 83.2 |

With reference to Table 5, in solution 9, the sizes of the driving unit in the first overlapping region 41 is equal to the original sizes, the width of the driving unit in the second overlapping region 42 is increased by 10 microns, the size of the driving unit in the third overlapping region 43 is increased by 10 microns, both the length and width of the driving unit in the fourth overlapping region 44 are increased by 10 microns, and other sizes are equal to their original values. The horizontal resolution of the display panel is decreased by 42 columns, the vertical resolution is decreased by 22 rows, and the optical transmittance of the driving unit in the fourth overlapping region 44 is increased by 21.2%, which significantly improve the accuracy of fingerprint recognition. In solution 10, the width of the driving unit in the second overlapping region 42 is increased by 20 microns, the size of the driving unit in the third overlapping region 43 is increased by 20 microns, both the length and width of the driving unit in the fourth overlapping region 44 are increased by 20 microns, and other sizes are equal to their original sizes. The horizontal resolution of the display panel is decreased by 68 columns, the vertical resolution is decreased by 36 rows, and the optical transmittance is further increased, thereby improving the accuracy of fingerprint recognition.

TABLE 6

| 6.01FHD (18:9) | Original sizes | Solution 11 | Solution 12 |
|---|---|---|---|
| Resolution | 1080 * 2160 | 1080 * 2160 | 1080 * 2160 |
| Sizes of the driving unit in the first overlapping region (width * length) | 31.2 * 63.2 | 30.2 * 62.4 | 29.4 * 61.8 |
| Sizes of the driving unit in the second overlapping region | 31.2 * 63.2 | 41.2 * 62.4 | 51.2 * 61.8 |

TABLE 6-continued

| 6.01FHD (18:9) | Original sizes | Solution 11 | Solution 12 |
|---|---|---|---|
| (width * length) Sizes of the driving unit in the third overlapping region (width * length) | 31.2 * 63.2 | 30.2 * 73.2 | 29.4 * 83.2 |
| Sizes of the driving unit in the fourth overlapping region (width * length) | 31.2 * 63.2 | 41.2 * 73.2 | 51.2 * 83.2 |

With reference to Table 6, in solution 11, the width of the driving unit in the second overlapping region 42 is increased by 10 microns, the size of the driving unit in the third overlapping region 43 is increased by 10 microns, both the length and width of the driving unit in the fourth overlapping region 44 are increased by 10 microns, and other sizes of the driving units in the first overlapping region 41, the second overlapping region 42 and the third overlapping region 43 are reduced accordingly, the optical transmittance of the driving unit in the fourth overlapping region 44 is increased by 21.2% without changing the resolution of the entire panel remains. Solution 12 further enhances the optical transmittance of the driving unit in the fourth overlapping region 44 while ensuring that the resolution of the entire panel unchanged.

Figure 8:
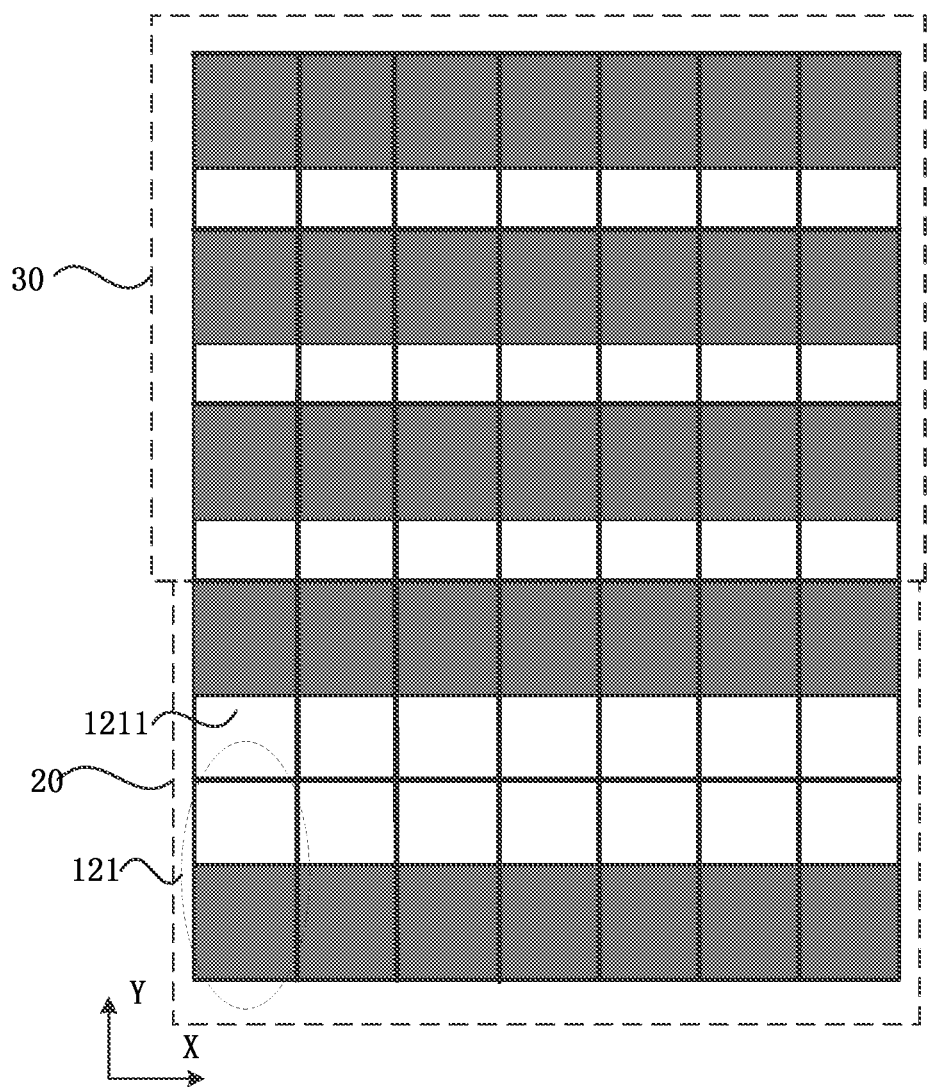
FIG. 8 is a schematic top view of another driving functional layer according to an embodiment of the present disclosure.

FIG. 8 is a top view of another driving functional layer according to an embodiment of the present disclosure. The foregoing embodiments show solutions to increase the area of the light transmitting region of the driving unit in the first region. In one or more embodiment, with reference to FIG. 8, the light transmitting regions 1211 of two rows of the first driving units 121 where the two rows are adjacent to each other along the second direction Y may be arranged adjacent to each other, such that a larger light transmitting region is obtained, thereby further improving the accuracy of fingerprint recognition.

It should be noted that, in other embodiments, the light transmitting regions of two columns of the first driving units 121 where the two columns are adjacent to each other along the first direction X are arranged to be adjacent to each other, no specific limitation in this embodiment.

Figure 9:
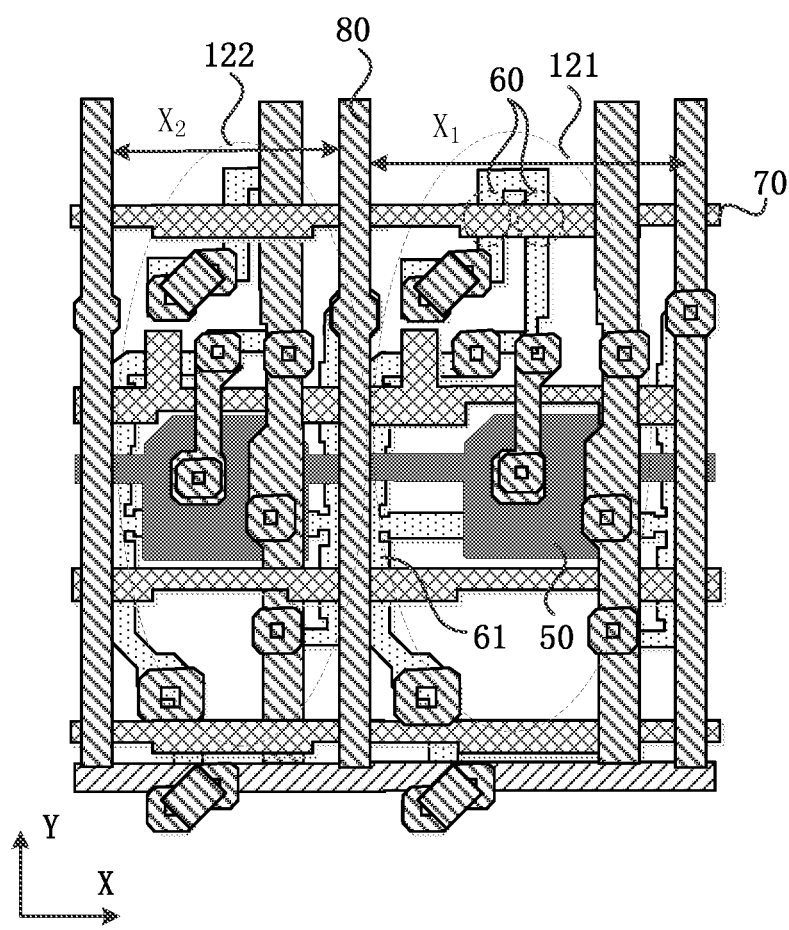
FIG. 9 is a diagram of a layout of a driving unit according to an embodiment of the present disclosure.

FIG. 9 is a diagram of a layout of the driving unit according to an embodiment of the present disclosure. In one or more embodiment, each of the driving units includes a plurality of driving circuit devices each including at least two thin film transistors 60 and at least one capacitor 50. A width-to-length ratio of a channel region of each of the at least two thin film transistors 60 in the first driving unit 121 is equal to a width-to-length ratio of the channel region of each of the at least two thin film transistors 60 in the second driving unit 122, and the area of the at least one capacitor 50 of the first driving unit 121 is equal to the area of the at least one capacitor 50 of the second driving unit 122.

The channel region of the thin film transistor is a region of the active layer of the thin film transistor corresponding to the gate or the scanning line. With the foregoing configuration, the consistency of switch performances and driving abilities of the thin film transistor and the consistency of the performances of the capacitors of the entire panel are ensured, thereby ensuring the display uniformity of the entire display panel.

Figure 10:
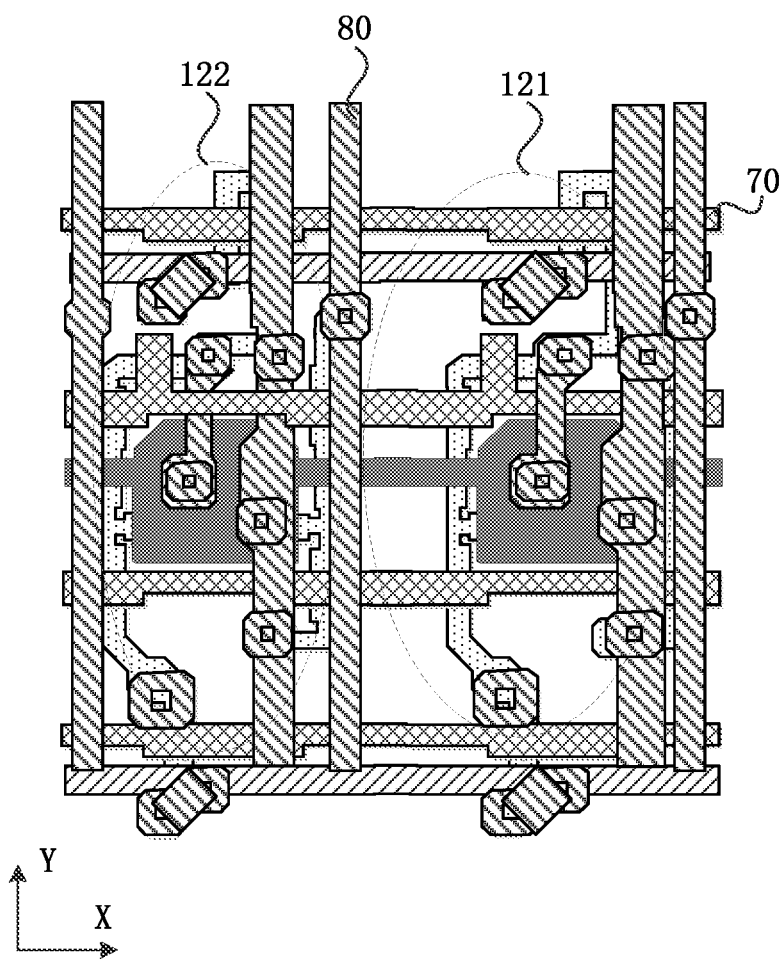
FIG. 10 is a diagram of another layout of a driving unit according to an embodiment of the present disclosure.

FIG. 10 is a diagram of the layout of another driving unit according to an embodiment of the present disclosure. FIG. 9 and FIG. 10 merely show the layouts of the first driving unit and the second driving unit, and do not intend to limit the present disclosure. The following is a detailed description regarding the distribution of the light transmitting regions of the first driving units in combination with FIG. 9 and FIG. 10. The light transmitting region of each driving unit includes the regions between the plurality of driving circuit devices and the regions between the driving circuit devices and the signal lines. With reference to FIG. 9, a larger light transmitting region may be obtained by increasing the spacing between parts of the drive circuit devices in the first driving unit 121 along the first direction X, that is, by making the drive circuit devices to be distributed more sparse along the first direction. Exemplarily, the distance, in the first direction X, between the capacitor 50 and the active layer 61 that extends along the second direction Y may be increased to obtain a larger light transmitting region. Referring to FIG. 10, a larger light transmitting region may be obtained in such a manner that all the driver circuit devices as a whole are translated along the first direction X without changing the spacing of the drive circuit devices to increase the distance between the driver circuit device and the second signal line 80.

It should be noted that FIG. 9 and FIG. 10 merely exemplarily show the specific distribution of the light transmitting regions when the first size of the first driving unit is increased, does not intend to limit the present disclosure. In other embodiments, a larger light transmitting region may be obtained by selecting an appropriate way according to the specific layout design. In addition, when the lengths of the first driving unit in other directions are increased, the distribution of the light transmitting regions may be designed with referring to the foregoing methods.

Optionally, the first metal wire 70 includes scanning lines, and the second metal wire 80 includes data lines and a power line.

Figure 11:
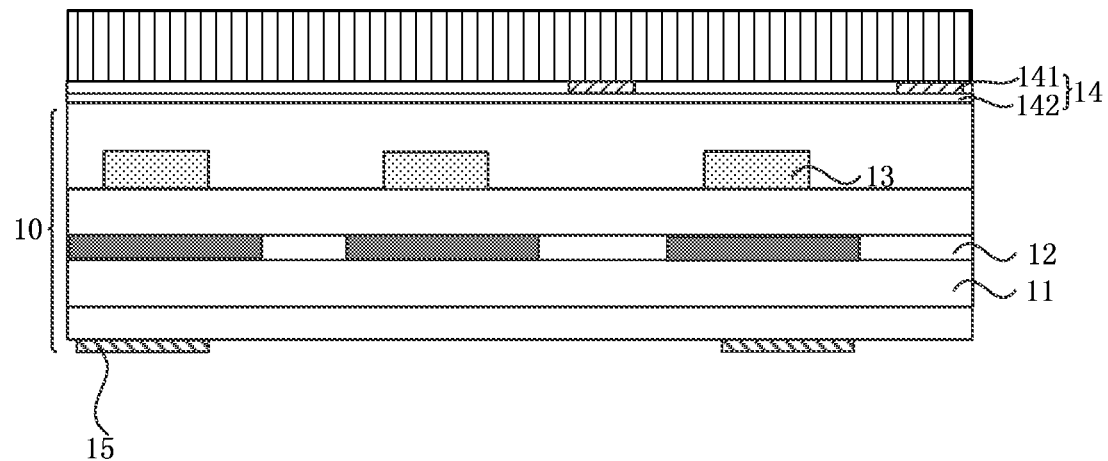
FIG. 11 is a sectional view of another display panel according to an embodiment of the present disclosure.

FIG. 11 is a sectional view of another display panel according to an embodiment of the present disclosure. In some embodiments, as shown in FIG. 11, the fingerprint recognition module 14 is arranged on a side of the driving functional layer 12 facing away from the base substrate 11, the fingerprint recognition light source 15 is an outer mounted light source, and the fingerprint recognition light source 15 is arranged on the side of the base substrate 11 facing away from the driving functional layer 12.

The fingerprint recognition light source 15 may be a collimated light source. Compared with a plane light source, the collimated light source can reduce the interferences of fingerprint scattered light between different fingerprint recognition units 141, thereby improving the accuracy of the fingerprint recognition.

Optionally, as shown in FIG. 11, the fingerprint recognition module 14 includes a fingerprint recognition panel 142, and the fingerprint recognition panel 142 is attached to the side of the driving functional layer 12 facing away from the base substrate 11.

The fingerprint recognition panel 142 may be transparent, the fingerprint recognition unit 141 is arranged on the fingerprint recognition panel 142, and is attached in the display panel through the fingerprint recognition panel 142. Exemplarily, fingerprint recognition panel 142 is attached to the encapsulating cover of the display panel.

Figure 12:
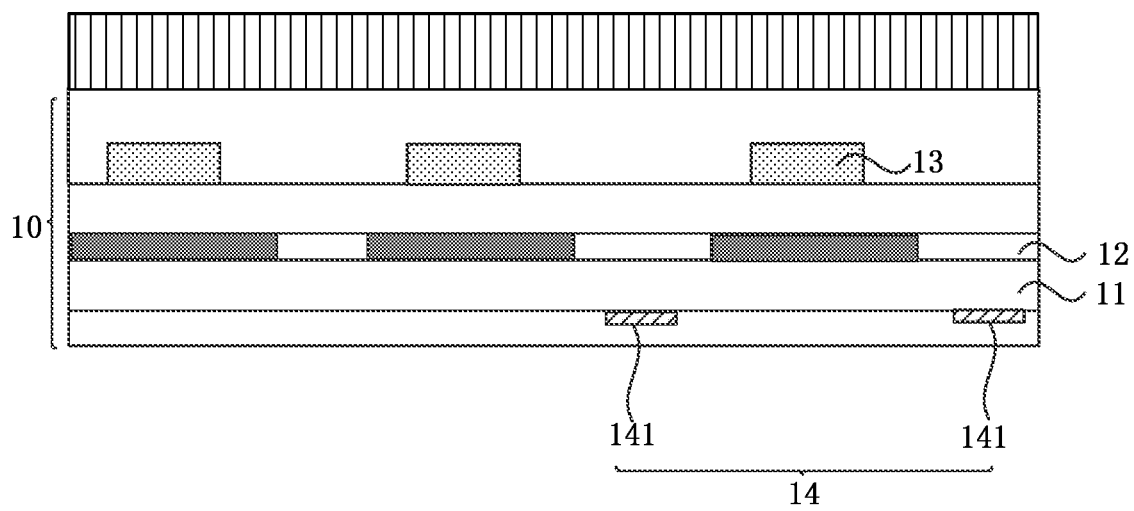
FIG. 12 is a sectional view of another display panel according to an embodiment of the present disclosure.

FIG. 12 is a sectional view of another display panel according to an embodiment of the present disclosure. As shown in FIG. 1 and FIG. 12, the fingerprint recognition module 14 is arranged on the side of the base substrate 11 facing away from the driving functional layer 12, and the fingerprint recognition light source 15 is arranged on the side of the driving functional layer 12 facing away from the fingerprint recognition module 14. In an alternative embodiment, the light-emitting functional layer 13 is reused as the fingerprint recognition light source.

Specifically, by arranging the fingerprint recognition module 14 on the side of the base substrate 11 facing away from the driving functional layer 12, it is ensured that the fingerprint recognition module 14 will not block the light emitted from the light-emitting functional layer 13, that is, the fingerprint recognition module 14 will not affect the view angle of the display panel. In addition, if the light-emitting functional layer 13 provides a light source for the fingerprint recognition unit 141, there is no need to provide an additional light source for the fingerprint recognition unit 141, such that the thickness of the display panel is reduced, which conforms to the development trend of thinner and lighter display panels.

Figure 13:
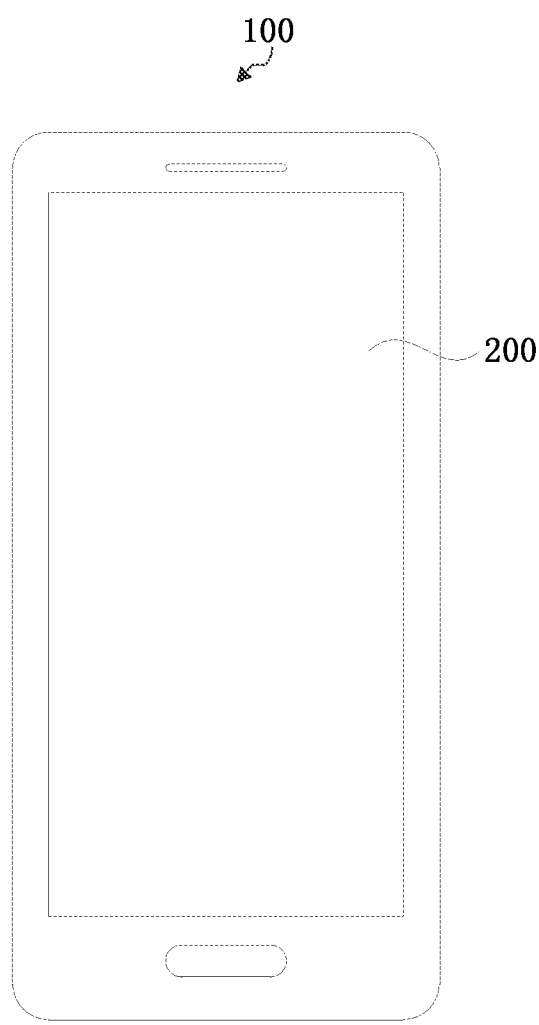
FIG. 13 is a schematic diagram of a display device according to an embodiment of the present disclosure.

FIG. 13 is a diagram of a display device according to an embodiment of the present disclosure. As shown in FIG. 13, the display device 100 includes the display panel 200 according to any embodiments of the present disclosure. The display device 100 can be a mobile phone, a tablet or other electronic device.

It should be noted that the above contents are only exemplary embodiments of the present disclosure and technical principles thereof. It should be understood by those skilled in the art that the present disclosure is not limited to specific embodiments described herein. For those skilled in the art, various apparent variations, readjustments and replacements can be made to the present disclosure without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by the attached claims.

What is claimed is:

1. A display panel, comprising:
   an array substrate, wherein the array substrate comprises a base substrate, a driving functional layer and a light-emitting functional layer, the driving functional layer is configured to drive the light-emitting functional layer to emit light;
   a fingerprint recognition module, wherein the fingerprint recognition module comprises at least one fingerprint recognition unit; and
   a fingerprint recognition light source, wherein light emitted from the fingerprint recognition light source is reflected by a touch object and then received by the at least one fingerprint recognition unit for a fingerprint recognition,
   wherein at least one of the fingerprint recognition module and the fingerprint recognition light source is located at a side of the base substrate facing away from the driving functional layer;
   wherein the driving functional layer comprises a plurality of driving units, the plurality of driving units comprise first driving units in a first region and second driving units in a second region;
   wherein an area of each of the plurality of first driving units is greater than an area of each of the plurality of second driving units, and an area of a light transmitting region of each of the plurality of first driving units is greater than an area of a light transmitting region of each of the plurality of second driving units;
   wherein a vertical projection of each of the at least one fingerprint recognition unit on the driving functional layer overlaps at least in part with the light transmitting region of one of the plurality of first driving units;
   wherein a first size of the first driving unit along a first direction is greater than a second size of the second driving unit along the first direction, and/or, a third size of the first driving unit along a second direction is greater than a fourth size of the second driving unit aloe the second direction: and wherein the first direction and the second direction cross each other; and
   wherein the driving functional layer comprises a first driving region and a second driving region, the first driving region and the second driving region are arranged side by side along the first direction, a size of the driving unit in the second driving region along the first direction is greater than a size of the driving unit in the first driving region along the first direction, a size of the driving unit in the second driving region along the second direction is equal to a size of the driving unit in the first driving region along the second direction; and the second driving region comprises the first region.

2. The display panel according to claim 1, wherein the display panel is a full high definition (FHD) display panel, a difference between the first size and the second size ranges from 2 microns to 20 microns; and a difference between the third size and the fourth size ranges from 5 microns to 30 microns.

3. The display panel according to claim 1, wherein the display panel is a wide quad high definition (WQHD) display panel, a difference between the first size and thee second size ranges from 1.5 microns to 15 microns; and a difference between the third size and the fourth size ranges from 4 microns to 20 microns.

4. The display panel according to claim 1, wherein the driving functional layer comprises a third driving region and a fourth driving region, the third driving region and the fourth driving region are arranged side by side along the second direction, a size of the driving unit in the fourth driving region along the second direction is greater than a size of the driving unit in the third driving region along the second direction, a size of the driving unit in the fourth driving region along the first direction is equal to a size of the driving unit in the third driving region along the first direction; and the fourth driving region comprises the first region.

5. The display panel according to claim 1, wherein the first driving region comprises a first driving sub-region and a second driving sub-region, and the first driving sub-region and the second driving sub-region are located on two sides of the second driving region respectively; and
   the size of the driving unit in the first driving sub-region along the first direction is greater than or equal to the size of the driving unit in the second driving sub-region along the first direction.

6. The display panel according to claim 4, wherein the third driving region comprises a third driving sub-region and a fourth driving sub-region; and
   the size of the driving unit in the third driving sub-region along the second direction is greater than or equal to the size of the driving unit in the fourth driving sub-region along the second direction.

7. The display panel according to claim 1, wherein each of the plurality of driving units comprises a plurality of driving circuit devices, each of the plurality of driving circuit devices comprises at least two thin film transistors and at least one capacitor; a width-to-length ratio of each of the at least two thin film transistors in the first driving unit is equal to a width-to-length ratio of each of the at least two thin film transistors in the second driving unit, and an area of the at least one capacitor of the first driving unit is equal to an area of the at least one capacitor of the second driving unit.

8. The display panel according to claim 1, wherein the driving functional layer further comprises a plurality of signal lines configured to provide driving signals to the plurality of driving units, the plurality of signal lines comprise a plurality of first metal wires extending along the first direction and a plurality of second metal wires extending along the second direction, the plurality of first metal wires have a same width, and the plurality of second metal wires have a same width.

9. The display panel according to claim 8, wherein the plurality of first metal wires comprise scanning lines, and the plurality of second metal wires comprise data lines and a power line.

10. The display panel according to claim 1, wherein the fingerprint recognition module is arranged on a side of the driving functional layer facing away from the base substrate, the fingerprint recognition light source is an outer mounted light source, and the fingerprint recognition light source is arranged on the side of the base substrate facing away from the driving functional layer.

11. The display panel according to claim 10, wherein the fingerprint recognition module comprises a fingerprint recognition panel, the fingerprint recognition panel is attached to a side of the driving functional layer facing away from the base substrate.

12. The display panel according to claim 1, wherein the fingerprint recognition module is arranged on the side of the base substrate facing away from the driving functional layer, and the fingerprint recognition light source is arranged on a side of the driving functional layer facing away from the fingerprint recognition module; or the light-emitting functional layer is reused as the fingerprint recognition light source.

13. A display device, comprising a display panel, wherein the display panel comprises:
an array substrate, wherein the array substrate comprises a base substrate, a driving functional layer and a light-emitting functional layer, the driving functional layer is configured to drive the light-emitting functional layer to emit light;
a fingerprint recognition module, wherein the fingerprint recognition module comprises at least one fingerprint recognition unit; and
a fingerprint recognition light source, wherein light emitted from the fingerprint recognition light source is reflected by a touch object and then received by the at least one fingerprint recognition unit for a fingerprint recognition,
wherein at least one of the fingerprint recognition module and the fingerprint recognition light source is located at a side of the base substrate facing away from the driving functional layer;
wherein the driving functional layer comprises a plurality of driving units, the plurality of driving units comprise first driving units in a first region and second driving units in a second region;
wherein an area of each of the plurality of first driving units is greater than an area of each of the plurality of second driving units, and an area of a light transmitting region of each of the plurality of first driving units is greater than an area of a light transmitting region of each of the plurality of second driving units;
wherein a vertical projection of each of the at least one fingerprint recognition unit on the driving functional layer overlaps at least in part with the light transmitting region of one of the plurality of first driving units;
wherein a first size of the first driving unit along a first direction is greater than a second size of the second driving unit along the first direction, and/or, a third size of the first driving unit along a second direction is greater than a fourth size of the second driving unit along the second direction; and wherein the first direction and the second direction cross each other; and
wherein the driving functional layer comprises a first driving region and a second driving region, the first driving region and the second driving region are arranged side by side along the first direction, a size of the driving unit in the second driving region along the first direction is greater than a size of the driving unit in the first driving region along the first direction, a size of the driving unit in the second driving region along the second direction is equal to a size of the driving unit in the first driving region along the second direction; and the second driving region comprises the first region.

14. A display panel, comprising:
an array substrate, wherein the array substrate comprises a base substrate, a driving functional layer and a light-emitting functional layer, the driving functional layer is configured to drive the light-emitting functional layer to emit light;
a fingerprint recognition module, wherein the fingerprint recognition module comprises at least one fingerprint recognition unit; and
a fingerprint recognition light source, wherein light emitted from the fingerprint recognition light source is reflected by a touch object and then received by the at least one fingerprint recognition unit for a fingerprint recognition,
wherein at least one of the fingerprint recognition module and the fingerprint recognition light source is located at a side of the base substrate facing away from the driving functional layer;
wherein the driving functional layer comprises a plurality of driving units, the plurality of driving units comprise first driving units in a first region and second driving units in a second region;
wherein an area of each of the plurality of first driving units is greater than an area of each of the plurality of second driving units, and an area of a light transmitting region of each of the plurality of first driving units is greater than an area of a light transmitting region of each of the plurality of second driving units;
wherein a vertical projection of each of the at least one fingerprint recognition unit on the driving functional layer overlaps at least in part with the light transmitting region of one of the plurality of first driving units;
wherein a first size of the first driving unit along a first direction is greater than a second size of the second driving unit along the first direction, and/or, a third size of the first driving unit along a second direction is greater than a fourth size of the second driving unit along the second direction; and wherein the first direction and the second direction cross each other; and
wherein the driving functional layer comprises a first driving region and a second driving region, the first driving region and the second driving region are arranged side by side along the first direction, a size of the driving unit in the second driving region along the first direction is greater than a size of the driving unit in the first driving region along the first direction;

the driving functional layer further comprises a third driving region and a fourth driving region, the third driving region and the fourth driving region are arranged side by side along the second direction, a size of the driving unit in the fourth driving region along the second direction is greater than a size of the driving unit in the third driving region along the second direction; and an overlapping region between the fourth driving region and the second driving region comprises the first region.

15. The display panel according to claim 14, wherein the first driving region comprises a first driving sub-region and a second driving sub-region, and the first driving sub-region and the second driving sub-region are located on two sides of the second driving region respectively; and the size of the driving unit in the first driving sub-region along the first direction is greater than or equal to the size of the driving unit in the second driving sub-region along the first direction.

16. The display panel according to claim 14, wherein the third driving region comprises a third driving sub-region and a fourth driving sub-region; and the size of the driving unit in the third driving sub-region along the second direction is greater than or equal to the size of the driving unit in the fourth driving sub-region along the second direction.

* * * * *